(12) United States Patent
Slocum et al.

(10) Patent No.: US 6,448,575 B1
(45) Date of Patent: Sep. 10, 2002

(54) TEMPERATURE CONTROL STRUCTURE

(75) Inventors: Alexander H. Slocum, Bow; Andreas C. Pfahnl, Goffstown, both of NH (US); Ernest P. Walker, Weston; Ronald A. Sartschev, Dunstable, both of MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/497,010

(22) Filed: Feb. 2, 2000

Related U.S. Application Data
(60) Provisional application No. 60/158,540, filed on Oct. 8, 1999.

(51) Int. Cl.[7] ............................ H01L 23/58; H01L 23/34
(52) U.S. Cl. ....................... 257/48; 257/714; 324/765
(58) Field of Search .................... 324/760, 765; 219/497; 257/714, 707, 716, 48, 713; 118/724, 725; 438/715

(56) References Cited

U.S. PATENT DOCUMENTS

| | | | | |
|---|---|---|---|---|
| 4,926,118 A | | 5/1990 | O'Connor | 324/158 |
| 5,111,280 A | * | 5/1992 | Iversen | 257/714 |
| 5,307,011 A | | 4/1994 | Tani | 324/158 |
| 5,315,240 A | | 5/1994 | Jones | 324/158 |
| 5,420,521 A | | 5/1995 | Jones | 324/760 |
| 5,510,655 A | * | 4/1996 | Tanielian | 257/714 |
| 5,821,505 A | | 10/1998 | Tustaniwskyj et al. | 219/494 |
| 5,844,208 A | | 12/1998 | Tustaniwskyj et al. | 219/494 |
| 5,846,375 A | | 12/1998 | Gilchrist et al. | 156/345 |
| 5,847,293 A | | 12/1998 | Jones | 73/865.8 |
| 5,847,366 A | | 12/1998 | Grunfeld | 219/497 |
| 5,859,540 A | | 1/1999 | Fukumoto | 324/760 |

OTHER PUBLICATIONS

IBM TDB "Method for cooling a Stack of Laminated Chips" vol. 39 No. 11 p 151–152, Nov. 1996.*
Tuckerman et al *IEEE Electron Dev. Lett* pp 126–129 vol. EDL–2 No. 5 "High–Performance Heat Sinking for VLSI", May 1981.*
"Constant Temperature Control of a Device Under Test (DUT)—Part 1", Jerry I. Tustaniwskyj et al., EEP–vol. 19–2, Advances in Electronic Packaging—1997, vol. 2 ASME 1997, pp. 2031–2036.

* cited by examiner

Primary Examiner—Jerome Jackson, Jr.
(74) Attorney, Agent, or Firm—Daly, Crowley & Mofford, LLP

(57) ABSTRACT

A semiconductor structure for controlling the temperature of a component is described. The structure includes a resistive layer having one or more channels provided therein and having a resistance characteristic such that a signal applied thereto causes the resistive layer to generate heat. A cooling fluid is fed through the one or more channels to cool both the structure and a component disposed on the structure. By providing the cooling channels in the resistive layer, the heating and cooling sources are intermingled. The structure can optionally include precising and vacuum clamping structures, to locate and hold the component that is to be temperature controlled.

19 Claims, 6 Drawing Sheets

TEMPERATURE CONTROL STRUCTURE

RELATED APPLICATIONS

This application claims priority under 35 U.S.C. §119(e) from application Ser. No. 60/158,540 filed on Oct. 8, 1999 which application is hereby expressly incorporated herein by reference.

GOVERNMENT RIGHTS

Not applicable.

FIELD OF THE INVENTION

Background of the Invention

As is known in the art, semiconductor integrated circuits or "chips" are typically tested at three temperatures prior to shipment or inclusion in a larger device or module. While much of the testing is done at room temperature, since temperature can affect the performance of a semiconductor device, most chips are also tested at a cold temperature and a hot temperature.

To provide testing at multiple temperatures, a handling device that presents the chips to the tester often includes temperature conditioning chambers called soak chambers and de-soak chambers. In a soak chamber, the chips are heated or cooled to the desired test temperature. The chips are then moved to a test chamber where they are tested by placing and pressing them against electrical test contactors which are provided as part of the test chamber. The temperature of the test chamber is typically held at the desired test temperature. After testing the chips, the chips are moved to the de-soak chamber. The temperature of the de-soak chamber is selected to return the chips to room temperature.

A significant amount of time is required to heat or cool trays of chips to the required test temperature. The chambers must thus be large enough to hold several batches of chips so that there is always one batch at the required temperature. In addition, mechanical systems to move the chips between the various chambers are needed. A handling device having sufficient soak and de-soak chambers for testing at three temperatures would thus be relatively large and complex. Consequently, even though handlers can test a both hot and cold temperatures, many handlers are set up to test only at a hot or a cold temperature, but not both. Thus, there is delay in testing and moving the chips from one machine to another.

In one particular technique referred to as dynamic tri-temp, the chips are held against the electrical test contactors in a test chamber and the chips are rapidly heated or cooled to the required test temperature. Thus, testing at three temperatures is possible without moving the chips from the test chamber or off the electrical test contactors. This simplifies the testing process and, provided that the temperature of the chips can be changed quickly, can also speed up the testing process.

To ensure accurate results during testing, the temperature of the chip or device being tested must be controlled. It is, however, relatively difficult to control the temperature of the chips since due to advances on chip design and semiconductor manufacturing techniques the physical size and thermal mass of the chips has decreased while at the same time the amount of power dissipated by the chips has increased. As a result, chips now tend to heat rapidly during operation. If the test fixture in which the chips are tested does not have a thermal mass which is relatively low compared to the thermal mass of the chips being tested, it becomes difficult to rapidly switch the temperature of the device between a relatively high temperature and a relatively low temperature since it is necessary to also change the temperature of the test fixture.

It would, therefore, be desirable to provide a system for controlling the temperature of a device during dynamic tri-temp testing which has a relatively fast temperature response as well as good stability once a temperature set point is reached. It would also be desirable to provide a system which can be disposed in a relatively small test chamber. It would be further desirable to provide a system which allows good electrical contact to be made between a device under test and a tester. It would be still further desirable to provide a system in which many chips can be tested simultaneously.

SUMMARY OF THE INVENTION

One object of this invention is to provide a semiconductor structure for controlling the temperature of a device.

A further object of the invention is to fabricate the semiconductor structure by doping one side of a semiconductor wafer, machining or otherwise forming fluid passages into the wafer, and then joining two such wafers to provide a semiconductor structure which includes both a heating element and a cooling element.

A further object of the invention is to provide power to a region of a semiconductor layer doped such that application of the power to the region generates heat.

A further object of the invention is to pass cooling fluid through channels provided in a layer of a semiconductor device wherein the layer also provides heat.

A further object of the invention is for the heating and cooling sources produced by heating and cooling regions provided in a single semiconductor wafer to be co-mingled rather than stacked in series, so as to minimize system mass and thermal response time.

A still further object of the invention is to provide a vacuum feedthrough to enable a device to be vacuum held firmly on a structure.

A still further object of the invention is to provide a temperature control device having a precising structure to help guide and locate the device such that the device can be precisely and accurately located with respect to electrical test contactors.

A still further object of the invention is to integrate the temperature control device with the integrated circuit structure of a semiconductor device to eliminate the need for a mechanical contact interface between temperature control structure and semiconductor device structure, thus enabling direct temperature control of a semiconductor device with minimal energy requirements. This will enable a semiconductor device to operate at very low temperatures, and enable devices such as CMOS chips to run considerably faster and with lower leakage. For CMOS chips, speeds at liquid nitrogen temperature are 3 to 4 times that at room temperature, and device leakage is reduced by 3 orders of magnitude.

In accordance with the present invention, a temperature control structure includes a first electrically insulating layer having first and second opposing surfaces, a resistive layer having first and second opposing surfaces and having one or more channels provided therein with at least a portion of said resistive layer having a resistance characteristic such that a signal applied to the resistive layer causes heat to be generated, with the first surface of said resistive layer disposed over the first surface of said first electrically insulating layer. The temperature control structure further includes a second electrically insulating layer having first and second opposing surfaces with the first surface of said second electrically insulating layer disposed over the second surface of said heat generating layer.

With this particular arrangement, a temperature control structure for controlling the temperature of a circuit component is provided.

The resistive layer having the one or more channels can be provided from micromachined semiconductor wafers, such as silicon wafers. The wafers are doped such that application of power to the wafer results in heat generated by the semiconductor structure itself. A cooling fluid can be fed through the one or more channels provided directly in the resistive layer. In this manner the temperature control structure is provided having intermingled heating and cooling sources. This results in a system having a relatively low thermal mass and having a relatively rapid thermal response time. In one embodiment, the structure can be fabricated by diffusion bonding doped silicon wafers to provide the structure as an essentially monolithic structure. Because the temperature control structure is essentially monolithic, there are no differential thermal stresses to cause thermal fatigue, and there are no mechanical interfaces between elements which could create a variance in performance between systems. Furthermore, precising and vacuum clamping structures can be integrated into the temperature structure to locate and hold a component that is to be temperature controlled during testing.

It should be appreciated that the structures and techniques described herein have application to dynamic tri-temp testing as well as conventional handling applications in which a handler although capable of operating over a range of temperatures is operated only at a single temperature because of the time required to change the temperature from hot to cold or vice versa.

In accordance with a further aspect of the present invention, a method for controlling the temperature of a device under test comprises the steps of placing the device under test onto a semiconductor structure, monitoring a temperature of the device under test, providing a temperature signal having a characteristic which corresponds to the temperature of the device under test, comparing the temperature signal to a predetermined temperature signal threshold value, in response to the temperature signal being greater than the temperature signal threshold value, heating a layer of the semiconductor structure to a predetermined temperature level and in response to the temperature control signal being less than the temperature signal threshold value, cooling a layer of the semiconductor structure to a predetermined temperature level. To heat a layer of semiconductor structure, a signal can be applied to a resistive layer of the semiconductor structure. To cool a layer of semiconductor structure, a cooling fluid can be introduced into a channel of the semiconductor structure. With this particular arrangement, a technique for controlling the temperature of a device under test by applying signals and cooling fluid to a semiconductor structure is provided. This results in the ability to rapidly heat and cool the device under test. If the resistive layer of the semiconductor structure is co-mingled or interdigitated with the channel of the semiconductor structure into which the cooling channels are fed, a relatively rapid heating and cooling technique is provided.

BRIEF DESCRIPTION OF THE DRAWINGS

The foregoing features of the invention, as well as the invention itself may be more fully understood from the following detailed description of the drawings, in which.

DESCRIPTION OF THE PREFERRED EMBODIMENTS

Figure 1:
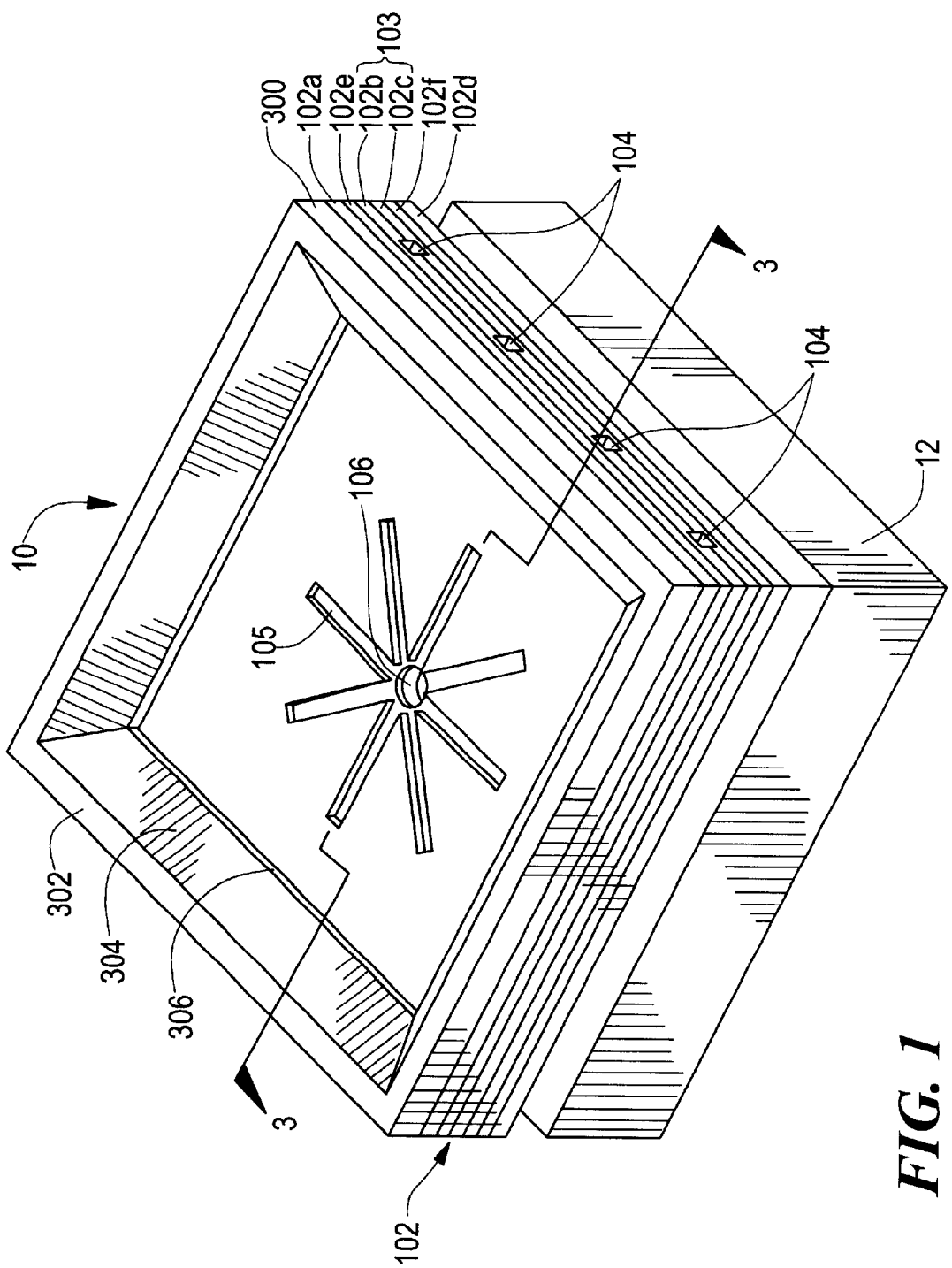
FIG. 1 is an isometric view of a temperature control structure.

Referring now to FIG. 1, a device temperature control and holding structure 10 includes an insulating base 12 having coupled thereto a semiconductor structure 102 which can be provided, for example, from a plurality of individual semiconductor layers 102a–102f. The structure 102 can be provided from any semiconductor material such as gallium arsenide or other Group III-V semiconductor materials. The structure 102 can be coupled to the base 12 using a variety of techniques including but not limited to attachment to the base 12 via an insulating adhesive.

In one embodiment, the layers 102a–102f are provided as silicon wafers which are diffusion bonded or otherwise joined to effectively provide the semiconductor structure 102 as a monolithic silicon structure 102. Since the silicon structure 102 is effectively monolithic, the structure 102 has a reduced number of regions which can result in thermal fatigue or inter-layer discontinuities.

Silicon layers 102a and 102d are provided as undoped layers having an insulation characteristic while silicon layers 102b and 102c are doped with a dopant such that the layers correspond to conductive regions having desired electrical resistance. Layers 102e, 102f are provided having an electrical insulating characteristic and may, for example, be provided as an oxide layer such as an insulating silicon oxide electrical insulator layers. It should be appreciated that in some applications it may be desirable to dope only certain regions of the layers 102b, 102c and that the particular shape of the desired regions (e.g. including but not limited to triangular, square, rectangular, polygonal, round, oval,) defines the resistance characteristic of the region.

When a heating signal (e.g. a voltage or a current signal) is provided to layers 102b, 102c , current flows through the layers 102b, 102c. The resistance characteristic of layers 102b, 102c causes the layers to dissipate energy in the form of heat. The doped layers 102b and 102c thus form a monolithic heater 103.

The heating signal can be supplied, for example, by coupling an electrical current or voltage source to layers 102b, 102c. The current or voltage source can be coupled to layers 102b, 102c using a variety of techniques well known to those of ordinary skill in the art. For example, layers 102b, 102c can be contacted directly with a conductive line (e.g. a copper or other conductive line or probe) brought into contact with exposed ends of the layers 102b, 102c). Alternatively, or in addition to the above approach, the layers 102b, 102c can be provided having a conductive via hole provided therein and a conductor or probe could be applied to layers 102b, 102c through the conductive via hole. In this case it may be necessary or desirable to provide either or both of the layers 120b, 102c having a conductor disposed thereon. The conductor can be used to ensure that power is appropriately distributed on the layers 102b, 102c such that the layers 102b, 102c provide a desired amount of heat in desired regions. The conductor can be provided using any technique well known to those of ordinary skill in the art including but not limited to patterning or deposition techniques.

It should be appreciated that the layers 102b, 102c can be formed using a variety of techniques including but not limited to direct ion impingement techniques, epitaxial growth techniques, Chemical Vapor Deposition (CVD) techniques or Metal Oxide CVD (MOCVD) techniques. Likewise any doping technique compatible with any of the above techniques may be used to provide layers 102b, 102c. In short, any technique can be used to provide layers 102b, 102c as long as the net result is the provision of a monolithic semiconductor structure with electrical resistance set to a desired level such that when current flows through the layer, a desired heat generation rate can be obtained. Controlling the temperature in this way allows control of device leakage and speed of CMOS devices. In test, it is desirable to operate at the same temperature as the chip will have in the application so it will have the correct delay and leakage.

Structure 102 also has provided therein one or more passages or paths 104 through which flows a temperature controlled fluid. As can be clearly seen in FIG. 3, the coolant paths 104 run through the center of the heater layers 102b, 102c and thus the hot and cold sources are co-mingled. That is, the heating and cooling sources provided by the heater 103 and cooling channels 104 are interdigitated structures. This approach provides the temperature control structure having relatively uniform and rapid heating and cooling characteristics. In some applications, it may not be desirable or preferred to provide an interdigitated heating/cooling sources, and then one could conceivably add more layers to the structure to provide a thin separation between the heating and cooling layers (rather than have the heating and cooling sources be co-planar or substantially co-planar); on the other hand, the heating and cooling zones could be placed side-by-side in an alternating pattern. This arrangement results in a compact structure which is capable of rapid temperature changes.

It should be appreciated that whatever the particular pattern the heating and cooling sources have, it should preferably appear to the device being heated and/or cooled that the heating and cooling emanate from the same or substantially the same physical location.

In addition, in preferred embodiments, the entire structure 102 is manufactured from a semiconductor material (e.g. silicon) that has been provided or otherwise effectively formed into a single-material, monolithic structure. Since the structure 102 is essentially monolithic, it does not include regions which are subject to the thermal fatigue and delamination problems as are prior art structures. Furthermore, the monolithic approach results in a structure having less mass than prior art structures.

Formed in the semiconductor layer 102a are one or more vacuum channels 105. Each of the vacuum channels 105 are in fluid communication with a central vacuum hole 106 having a first end exposed to vacuum channels 105. Vacuum hole 106 runs through each of the layers 102a–102f and through base 12. A second end of the vacuum hole 106 is adapted to couple to a vacuum apparatus (not shown) known to those of ordinary skill in the art for vacuum gripping parts.

In this particular embodiment, the vacuum channels 105 form a star or snow-flake pattern. It should be appreciated that other patterns including but not limited to those having a square, rectangular, circular, triangular or irregular shape could also be used. The particular pattern for vacuum channels 105 selected for any particular application depends upon a variety of factors including but not limited to the amount of vacuum pressure required to hold a device to the structure 10, the amount of space available for channels 105, the width and length of channels 105 and the shape and weight of the device to be held. Those factors considered in the art of vacuum channel design should be considered in selecting the size and shape of channels 105 for any particular application.

The device holding structure 10 also includes an optional precising structure 300 having a top surface 302, a beveled side surface 304 and a seating surface 306. In one embodiment, precising structure 300 is manufactured from any thermally non conductive material known to those of ordinary skill in the art including but not limited to low-density aluminum oxide. It should be appreciated, however, that in some applications portions of or even the entire precising structure 300 may be provided from thermally conductive materials. The precising structure 300 is disposed over a top surface of semiconductor layer 102a, and can be coupled to the layer 102a using bonding techniques, fastening techniques or any other technique known to those of ordinary skill in the art.

It should be noted that in some applications, it may be desirable to replicate device holding structure 10 to provide a large array of such device holding structures 10 to, in effect, form a tray. For clarity, however, only a single structure 10 is shown in FIG. 1.

In an alternate embodiment, an integrated circuit (IC) such as a complementary metal oxide semiconductor (CMOS) IC can be manufactured directly layer 102a. In this case, the channels 105 and hole 106 are omitted. With this arrangement an IC that is efficiently temperature controlled during operation is provided. In this manner it may be possible to manufacture CMOS devices which can operate at relatively high switching speeds and which have relatively low noise levels. Controlling the temperature in this way allows control of device leakage and speed of CMOS devices. This has several advantages. By cooling the part, the speed of the part is increased, and device leakage is reduced. In the extreme case of operating at liquid nitrogen temperature (77 K) or liquid argon temperature (90 K.), delay is increased 3 to 4 times and device leakage is reduced by 3 orders of magnitude (1000 times). Thermal voltage noise and thermal current noise in the device is proportional to the square root of the Kelvin temperature, so at liquid argon temperature the thermal voltage noise is reduced by 46% compared to room temperature.

In addition, by operating at a temperature restricted to a narrow range, the variation of delay in the part is reduced. This is important in timing applications such as Automated Test Equipment (ATE) because if the ATE system is calibrated at only one temperature, and if the temperature is held closer to the calibrated temperature, the error in time delay measurements will be reduced.

Another application is that during wafer probe the IC can brought to the temperature that the IC will see in the final application. This allows more accurate calibration and trimming of the IC, and make measurements more representation of the real performance of the IC.

Figure 2:
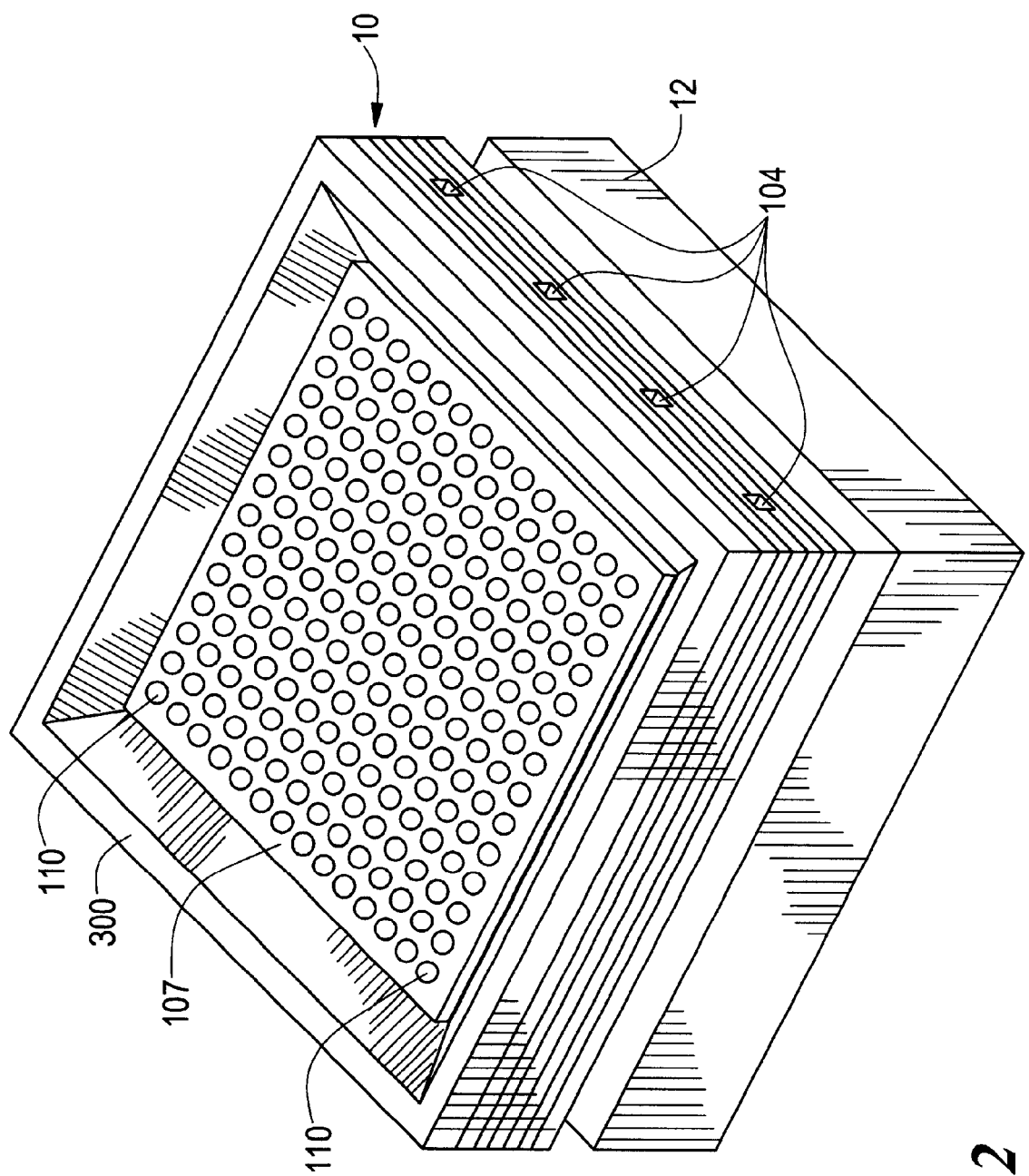
FIG. 2 is an isometric view of a temperature control structure having a device disposed therein.

Referring now to FIG. 2 in which like elements of FIG. 1 are provided having like reference designations, the system 10 is shown having a part 107 disposed therein. In this particular example, the part 107 corresponds to a semiconductor device packaged as a ball grid array (BGA) and thus balls 110 are exposed. It should be noted, however, that part 107 could alternatively be provided as a semiconductor device designed to synthesize new drugs or chemical compounds by the principle of combinatorial chemistry. Combinatorial chemistry is highly dependent on thermal processes and a system such as the system 10 provides a new design parameter for chemists to utilize. For example, chemists can study the effect of extremely rapid temperature changes on the formation of new molecules. This may allow generation and rapid freezing of otherwise unstable compounds.

Figure 3:
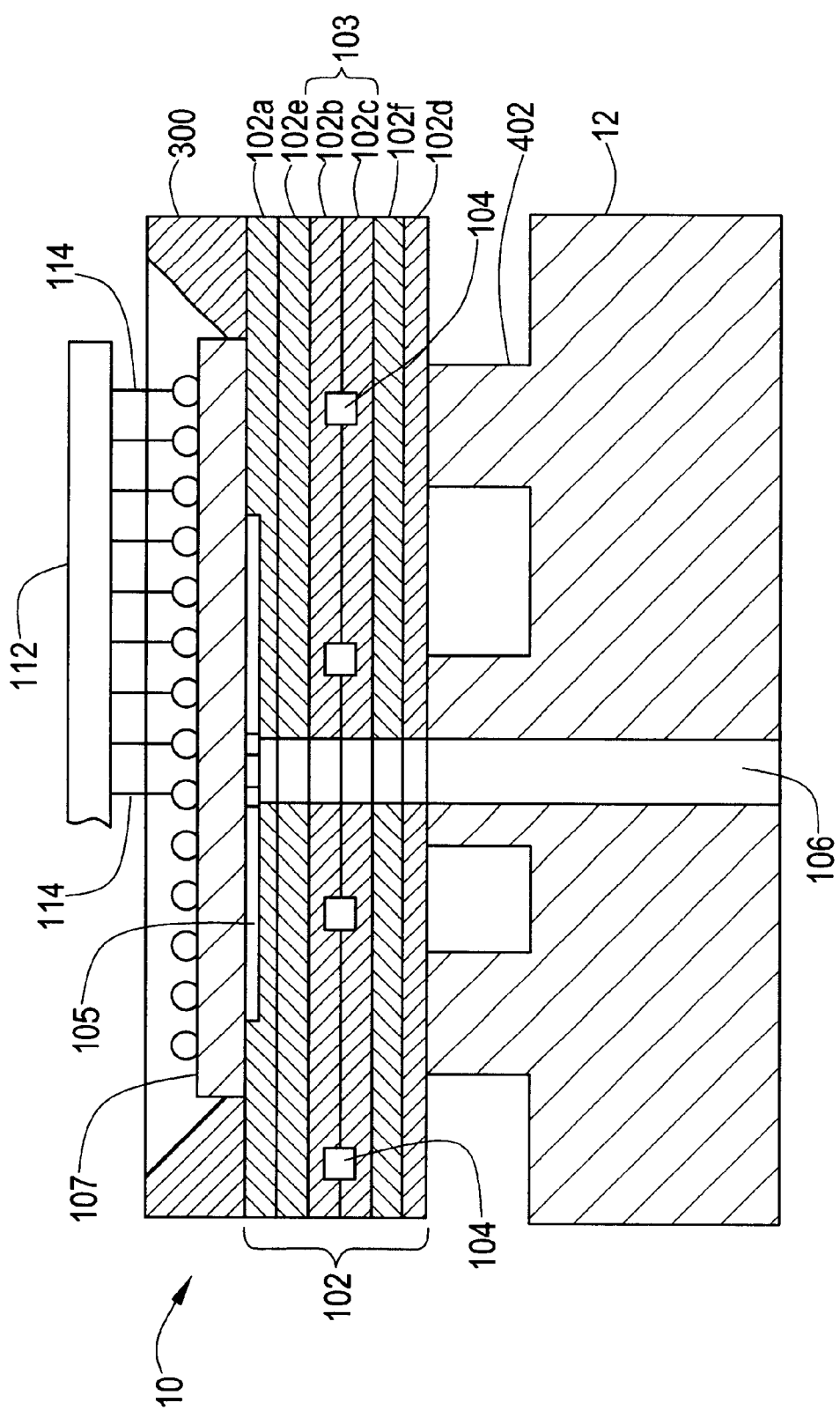
FIG. 3 is a cross sectional view of a temperature control structure holding a device taken along lines 3—3 in FIG. 2.

As shown in FIG. 2, the precising structure 300 accurately locates the device 107 in position such that the device 107 can be placed in contact with probes of a chip tester (FIG. 3).

Referring now to FIG. 3, the system 10 has the BGA device 107 disposed therein and precisely located by the thermally and electrically insulating precisor 300 which is coupled to a first surface of electrically non conducting layer 102a of the structure 102.

Vacuum passages 105, connected to Vacuum port 106, ensure that the device 107 is held firmly in contact with the top surface of layer 102a which is an important consideration in maximizing heat transfer rates. For a combinatorial chemistry application, the wells for the experiments could be etched directly into the surface of layer 102a as will be discussed below in conjunction with FIGS. 9 and 10.

Disposed above the device 107 is a chip tester 112 (only a portion of which is shown in FIG. 3 for clarity) having a plurality of probes 114. Electrical contacts of the device 107 (in this case the balls 110) are brought into contact with probes 114. Once contact is made between the device electrical contacts 110 and probes 114, the temperature of the device 107 is controlled by controlling the amount of heat generated by heater 103 and the temperature and flow of the coolant provided in the cooling channels 104.

The arrangement of a heating layer 103 and a cooling channel 104 results in a thermal control system which can provide a relatively rapid thermal response to changes in temperature of the device 107. Furthermore, the structure of the present invention does not have the thermal fatigue drawbacks present in the prior art layered-component techniques.

The bottom layer 102d is an optional layer which corresponds to an electrical insulator. Layer 102d can be omitted if the surface of the structural support 12 on which structure 102 is disposed and its thermal isolation posts 402 provide a relatively high degree of electrical insulation between support 12 and structure 102. In some embodiments it may be desirable or necessary to provide an insulating material, such as an aerogel (i.e. a structural material which is 90% or more air), which serves this support and electrical and thermal insulation function to further reduce system mass.

It should be appreciated that although channel 104 is here shown having one-half of the channel 104 provided in layer 102b and on-half provided in layer 102c, it may in some embodiments be desirable to provide the entire channel 104 in either layer 102b or layer 102c. Thus, in such a case, only one of the layers 102b, 102c would be provided having a channel therein.

Figure 4:
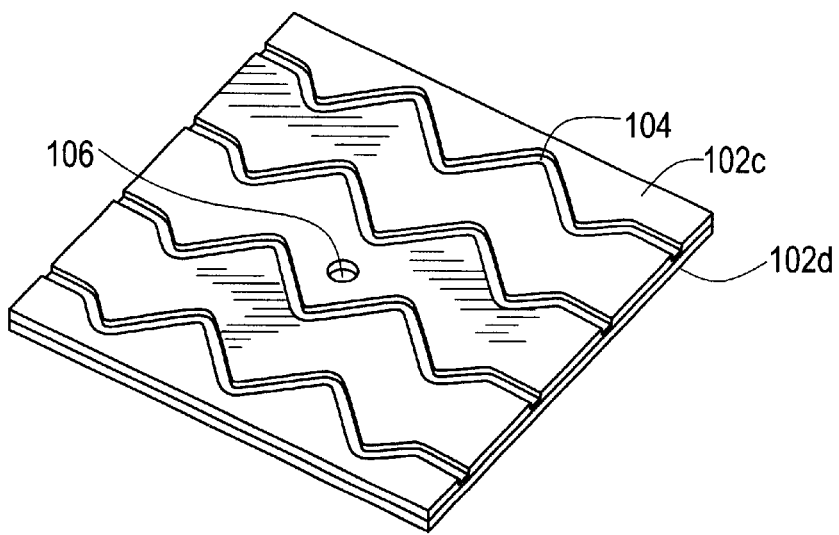
FIG. 4 is an isometric view of the bottom half of a semiconductor structure prior to diffusion bonding.
Figure 5:
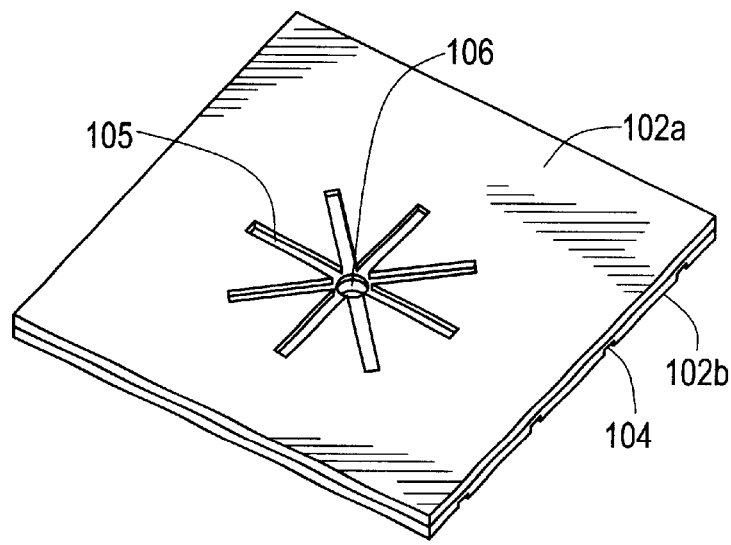
FIG. 5 is an isometric view of the top half of the semiconductor structure prior to diffusion bonding.

FIGS. 4 and 5 show the layers of the semiconductor material which are disposed to provide the structure 102. Layer 102d is an electrically non-conducting and layer 102c is a doped layer doped to a concentration such that the layer is provided having a desired resistance in x and y directions of the layer 102c (this assumes a right hand coordinate system in which the z-axis is in the same direction as a central longitudinal axis of vacuum hole 106). Thus, when the layer 102c is coupled to a power source, the resistance of the layer 102c causes energy to be dissipated in the layer 102c in the form of heat. Thus, layer 102c forms a heater layer.

Layer 102c also has provided therein one or more channels 104. By providing the channels 104 in close proximity to the device being cooled, channels 104 increase and ideally maximize heat transfer between a flowing fluid, such as liquid nitrogen, antifreeze, or a gas, and the heater structure 102c. The size and shape of channels 104 are preferably selected to provided sufficient surface in which a cooling fluid is disposed. The channels 104 can be provided in layer 102c using any technique well known to those of ordinary skill in the art including but not limited to etching and machining. In this particular embodiment, the channels 104 are disposed in a saw-tooth pattern. It should be appreciated, however, that the channels 104 can be provided in a variety of patterns including but not limited to square, rectangular, circular, triangular or irregularly shaped patterns. The particular pattern selected in any application depends upon a variety of factors including but not limited to the desired cooling capability, the width of the channels 104 desired length, flow rate, channel geometry and other factors considered in fluid heat exchanger designs.

Referring now to FIG. 5, layers 102b and 102a are functionally mirror images of layers 102c and 102d, respectively, discussed above in conjunction with FIG. 4. Specifically, layers 102a is an electrically non-conducting layer and layer 102b is doped to a concentration such that the layer 102b is providing having a desired electrical resistance in x and y directions of the layer 102b. In addition, layer 102a has the vacuum channels 105 provided in a surface thereof As mentioned above, vacuum hole 106 runs through each of the semiconductor layers 102a–102f. In this particular embodiment vacuum hole 106 is offset from a central longitudinal axis of the layers 102a–102f to accommodate the channels 104. In other embodiments, however, it may be preferable to provide vacuum hole 106 in the center of layers 102a–102f and to adjust the positions of the channels 104 accordingly.

Figure 6:
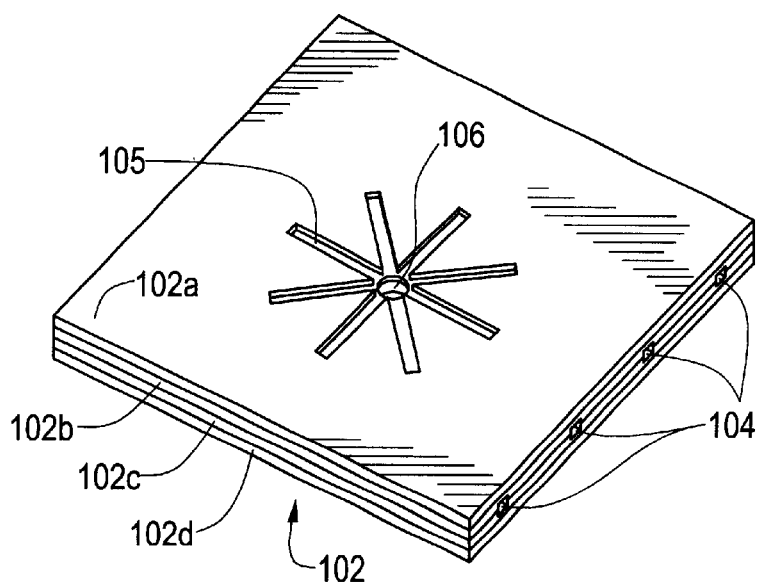
FIG. 6 is an isometric view of the bottom and top halves of the semiconductor structures after they have been diffusion bonded together.

In some embodiments it may also be desirable to provide layers 102d and 102c from a single semiconductor wafer. Similarly layers 102b and 102a could be provided from a single semiconductor wafer. In this case, the two wafers would be placed such that the surfaces of layers 102b and 102c face each other and channels 104 in each of the layers 102b, 102c are in alignment. The two wafers could then be diffusion bonded to effectively provide a monolithic semiconductor structure 102 having channels 104 as shown in FIG. 6. Ideally, structure 102 would be indistinguishable from a structure formed with a three-dimensional patterning or printing machine.

In addition, it may be advantageous to provide a shielding layer, such as a deposited metal ground plane, to shield current that flows through the layers 102c and 102d such that they cannot electrically interfere with circuits that may be placed on Layer 102a or 102f. This would require extra manufacturing steps, but this would be known to those skilled in the art.

It should be noted that if the fluid provided in channels 104 is electrically conductive, then an electrically insulating material could be appropriately disposed on portions of the surfaces of layers 102b, 102c including the surfaces of the channels 104 to electrically insulate the fluid from the layers 102b, 102c. For example, several microns of electrically insulating silicon oxide could be grown or otherwise disposed on the surfaces of 102b and 102c prior to the wafers being bonded together. If a non-conductive fluid (such as Florinert manufactured by E. I. Du Pont de Nemars & Co., Delaware is used in channels 104, the step process of covering the channels 104 with an insulator would not be required. Thus, in some cases it may be necessary to insulate the fluid from conductive regions of layers 102b, 102c while in other cases it may not be necessary.

In the case where the structure 102 is made from a semiconductor material such as silicon, gallium, gallium arsenide or the like, various sensors and logic circuits can also be provided as part of the structure 102. For example, temperature sensor circuits, logic circuits, control circuits, control logic circuits and even active circuits such as power amplifiers and relays could be fabricated as part of the structure 102 thereby reducing the number of external connections to the outside world. Thus, structure 102 can itself include one or more integrated circuits while at the same time the structure 102 can be used to control the temperature of an integrated circuit. Those of ordinary skill in the art would know how to design and fabricate such circuits using integrated circuit design and manufacturing techniques appropriately selected depending upon the type of material or materials from which the semiconductor structure 102 is provided.

It should be noted that in the case where the structure 102 includes one or more integrated circuits, care must be taken to ensure that the circuits provided as part of the structure 102 do not interfere with the ability of the structure 102 to regulated the temperature of the devices disposed in the structure 102 for testing purposes. For example, it may be desirable to select circuits to include in structure 102 which do not generate significant amounts of heat. If circuits which do generate significant amounts of heat are to be included in the circuit 102, it may be desirable to maximize the heating and/or cooling capabilities and capacities of the structure 102 such that both those circuits included as part of structure 102 as well as those circuits which circuit 102 is intended to temperature control can be appropriately serviced.

Referring now to FIG. 6, it should be noted that the semiconductor structure 102 does not contain any axial thermal resistance path between the cooling channels 103 and the heater structures 102b and 102c. Thus, the structure 10 provides a relatively rapid response when changing the temperature of the device.

Given that the thickness of a silicon wafer can be in the range of 0.3 millimeter (mm) or less, two such wafers can be bonded together to provide the structure 102 having a total thickness on the order of 0.5 mm. Such a thickness is about an order of magnitude thinner than the thickness of temperature control structures found in prior art systems. Furthermore, if the wafers are bonded using a diffusion bonding technique, the structure 102 is effectively provided as a solid monolithic part.

It should also be noted that for greater cooling capacity, the inclusion of larger or multiple passages 104 (FIG. 6) in the structure 102 does not substantially increase the mass of the system. In some embodiments, the thermal mass of the structure 10 can thus be an order of magnitude less than prior art systems. Therefore by providing the structure 102 from a semiconductor material having integrated heating and cooling elements, the structure 102 can be about one-third of the mass of the device being tested (e.g. device 107 in FIG. 2). Conversely, prior art structures are typically on the order of three times the mass of a typical device placed on the structure 102. Furthermore, by providing the structure 102 as a monolithic semiconductor structure having the channels 104 for cooling and the doped semiconductor layers 102b, 102c for heating, a structure having heating and cooling elements in the same plane is provided. Here the cooling channels are co-planar with the heating structure and the cooling channels are dispersed or co-mingled with the heating structure.

Figure 7:
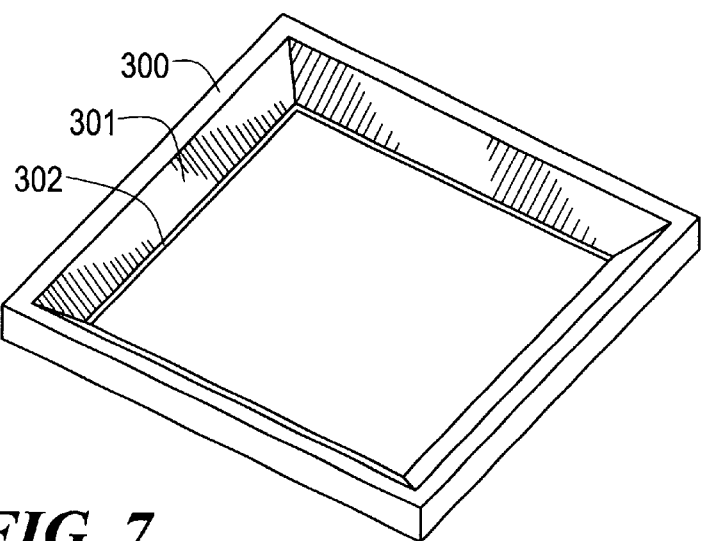
FIG. 7 is an isometric view of a precising structure.

Referring now to FIG. 7, in those applications in which a device such as an electrical device or a tray of chemical samples, is to be placed onto a temperature control structure (e.g. structure 102 in FIG. 6), a precising structure 300 is disposed over the temperature control structure to locate or precise the device. Precising structure 300 is provided having a tapered surface 302 which leads to a final inner locating surface 306. Precising structure 300 is preferably manufactured from a material which is a good thermal insulator. Precising structure 300 could be attached, coupled or fastened to the structure 102 using a variety of techniques including but not limited to bonding with a low shear strength high peel strength adhesive, to allow for differential thermal expansion without causing high stresses or deformations.

Figure 8:
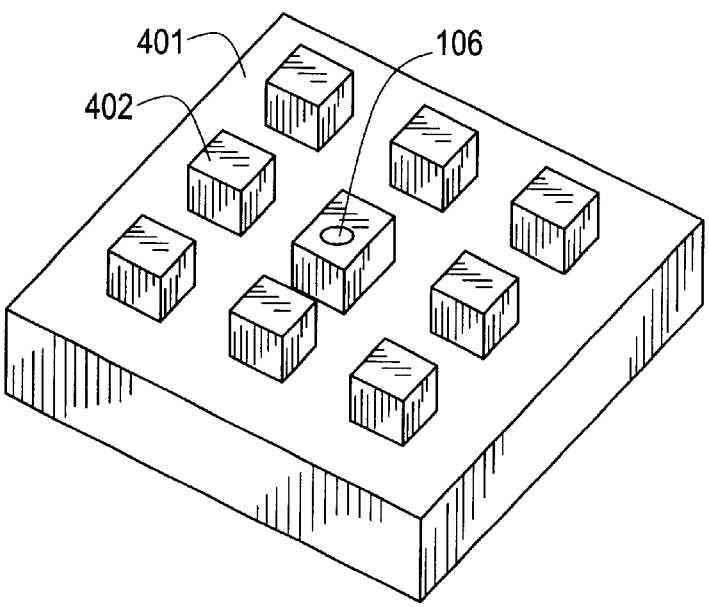
FIG. 8 is an isometric view of an insulating supporting structure.

Referring now to FIG. 8, a support structure 401 fabricated from a thermally non-conductive material includes a plurality of support posts 402. Support posts 402 project a predetermined distance above a surface of support 401 such that a bottom surface of layer 102 is also spaced a predetermined distance from a surface of support structure 401. The support posts 402 help to further thermally isolate the structure 102. Vacuum hole 106 passes through the one of the posts 402. Structure 102 could be attached, coupled or fastened to the support 401 using a variety of techniques including but not limited to bonding with a low shear strength high peel strength adhesive, to allow for differential thermal expansion without causing high stresses or deformations.

Figure 9:
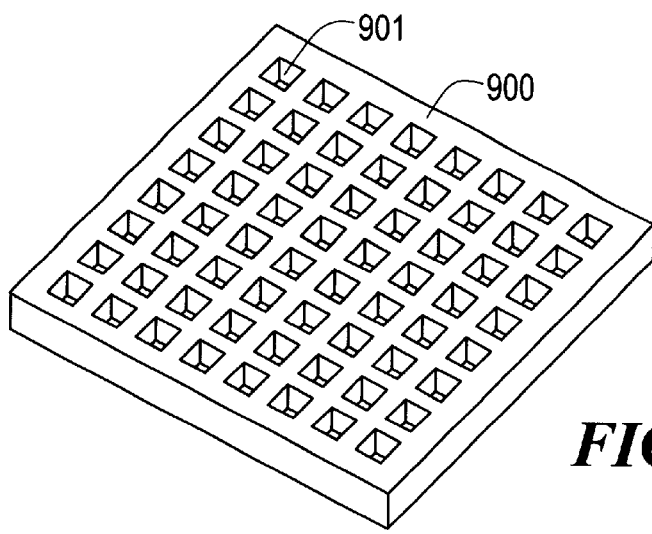
FIG. 9 is an isometric view of a combinatorial chemistry chip.

Referring now to FIG. 9, a combinatorial chemistry chip 900 having a plurality of wells 901 divided by walls 902 is shown. The chip 900 may be provided from any appropriately selected semiconductor material including but not limited to silicon, gallium and gallium arsenide. The wells 901 may be formed or otherwise provided in the chip using any subtractive or additive technique known to those of ordinary skill in the art. Each of the wells 901 can contain a different experiment. Since rapid precision temperature control is important for chemistry, the techniques of the present invention are well suited for use in such experiments and tests. Not shown, but known to those skilled in the art, are evaluation sensors and circuits which can be formed directly on the chip 900.

Figure 10:
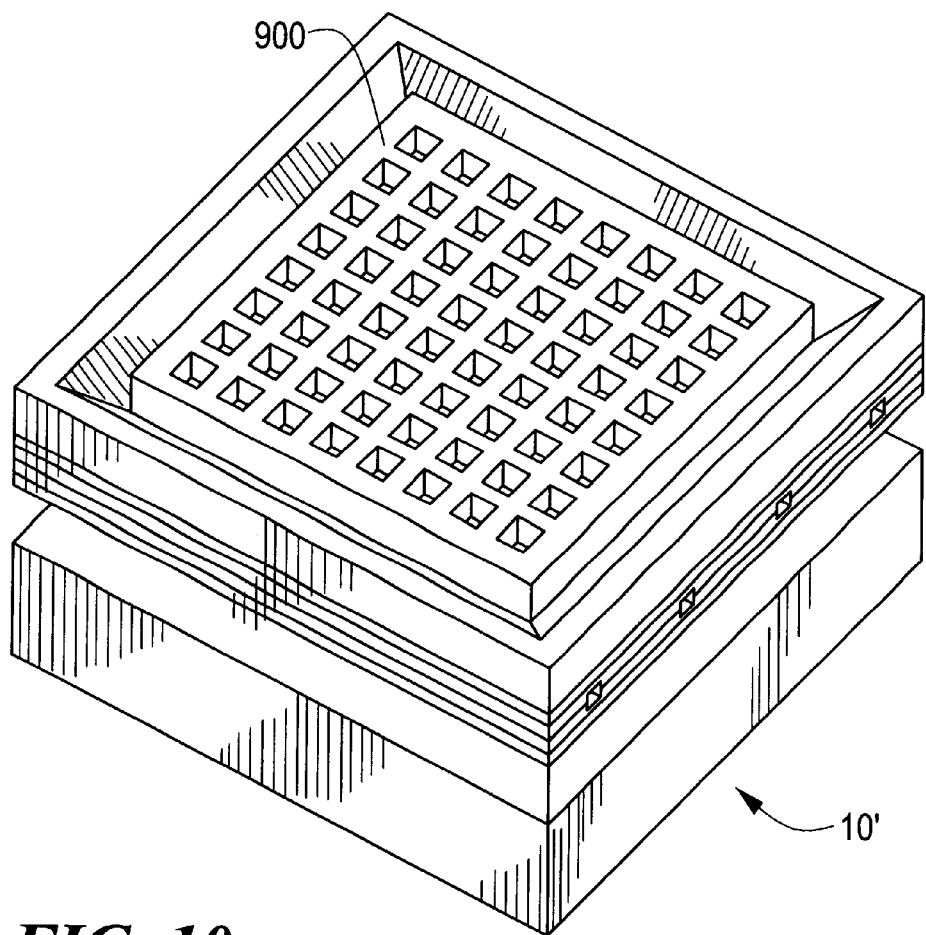
FIG. 10 is isometric view a device temperature control structure configured for combinatorial chemistry applications.

Referring now to FIG. 10, a system configured for combinatorial chemistry applications where the chip 900 is placed in a device holding structure 10'. Device holding structure 10' may be provided as the type described above in conjunction with FIGS. 1–8. In this manner, the temperature of the device 900 can be held or it can be changed from a first temperature to a second temperature.

Figure 11:
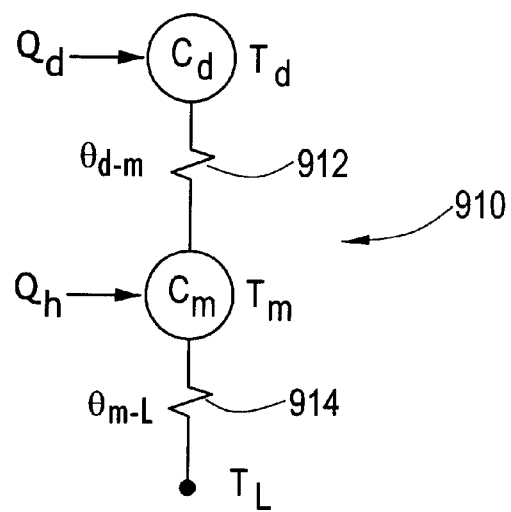
FIG. 11 is a schematic circuit diagram which represents a model of a device holding structure similar to the types shown in FIGS. 1–8.

Referring now to FIG. 11, the thermal performance characteristics of a device 10 can be approximately described by a thermal circuit 910 which includes a first device here represented as a thermal mass $C_d$, having a device temperature $T_d$. Thermal mass $C_d$ represents the thermal mass of a device under test (DUT) such as device 107 (FIG. 3). The device represented by thermal mass $C_d$ produces heat energy $Q_d$.

A thermal path having a thermal resistance $Q_{d-m}$ exists between the DUT represented as thermal mass $C_d$ and a thermal mass $C_m$ which represents heating/cooling structure 102 (FIG. 3). The thermal resistor 912 thus corresponds to the device to silicon-module contact thermal resistance (i.e. the resistance between the device and the silicon module). The temperature of the silicon-module $C_m$ is represented as temperature $T_m$ and the I²R heat generated by heat structure 103 is represented as $Q_h$.

A second thermal path having a thermal resistance $Q_{m-L}$ exists between the heating/cooling structure 102 and the cooling fluid in the passages 104. The thermal resistance $Q_{m-L}$ thus represents the silicon-module to cooling fluid convection thermal resistance. A thermal reference potential $T_L$ corresponds to the cooling fluid temperature.

The first-order equations for this system can be written by examining the heat flows at the device, whose temperature is $T_d$, and at the monolithic construction, whose temperature is $T_m$. The time rate of change of the device temperature can be expressed as:

$$\frac{dT_d}{dt} = \frac{Q_d - \left(\frac{T_d - T_m}{\theta_{d-m}}\right)}{C_d}$$

The time rate of change of the monolithic construction temperature can be expressed as:

$$\frac{dT_m}{dt} = \frac{Q_h + \left(\frac{T_d - T_m}{\theta_{d-m}}\right) - \left(\frac{T_m - T_L}{\theta_{m-L}}\right)}{C_m}$$

The thermal circuit 910 can be used to model the thermal characteristics of the silicon-module 10 and to analyze the thermal performance of the silicon-module 10. Thermal circuit 910 can also be used to optimize a thermal system which includes the silicon-module 10 using thermal design methods known to those of ordinary skill in the art.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A temperature control structure comprising:

a first electrically insulating layer having first and second opposing surfaces;

a resistive layer having first and second opposing surfaces and having one or more channels provided therein wherein at least a portion of said resistive layer is doped with a dopant to a dopant concentration selected such that a signal applied to said resistive layer causes heat to be generated, with the first surface of said resistive layer disposed over the first surface of said first electrically insulating layer; and a second electrically insulating layer having first and second opposing surfaces with the first surface of said second electrically insulating layer disposed over the second surface of said heat generating layer.

2. The device of claim 1 wherein:

said first and second electrically insulating layers are comprised of silicon dioxide; and said resistive layer is comprised of a Group III-V material.

3. The device of claim 2 further comprising:

a top layer comprised of a Group III-V material, said top layer disposed on the second surface of said first electrically insulating layer; and a bottom layer comprised of a Group III-V material, said bottom layer disposed on the second surface of said second electrically insulating layer.

4. The device of claim 3 further comprising an integrated circuit formed on at least one of said top and bottom layers.

5. The structure of claim 4 wherein:

said first and second layers are comprised of silicon oxide; and said top and bottom layers are comprised of silicon.

6. The device of claim 1 wherein the portions of said resistive layer which have been doped comprise those portions outside of the channels provided in said resistive layer.

7. A temperature control structure comprising:

a first semiconductor layer and having first and second opposing surfaces and having one or more fluid channels provided therein with at least a portion of said first semiconductor layer being doped with a predetermined dopant to a predetermined dopant concentration; and a second semiconductor layer having first and second opposing surfaces with the first surface of said first semiconductor layer disposed over the second surface of said second semiconductor layer, wherein at least a portion of said second semiconductor layer is doped with a predetermined dopant to a predetermined dopant concentration.

8. The structure of claim 7 wherein the first surface of said second semiconductor layer is provided having one or more fluid channels provided therein and wherein said first and second semiconductor layers are aligned such that the one or more fluid channels in said first semiconductor layer align with the one or more fluid channels in said second semiconductor layer.

9. The structure of claim 8 further comprising a third semiconductor layer having first and second opposing surfaces with the first surface disposed over the second surface of said first semiconductor layer and where said third semiconductor layer is provided having an insulating characteristic.

10. The structure of claim 9 wherein the first surface of said third semiconductor layer corresponds to an electrically insulating surface.

11. The structure of claim 10 wherein said electrically insulating surface is comprised of silicon dioxide.

12. The structure of claim 9 wherein the first, second and third semiconductor layers are provided as semiconductor wafers which are diffusion bonded to effectively provide the semiconductor structure as a monolithic semiconductor structure.

13. The structure of claim 12 wherein said first, second and third semiconductor layers are provided having a vacuum hole provided therein.

14. The structure of claim 13 wherein the second surface of said third semiconductor layer is provided having at least one vacuum channel in fluid communication with the vacuum hole.

15. The structure of claim 9 wherein portions of said first and second semiconductor layers are doped with a dopant such that said portions of said first and second layers correspond to conductive regions having a relatively high electrical resistance characteristic.

16. The structure of claim 15 further comprising a power source coupled to said first and second semiconductor layers.

17. A semiconductor device comprising:
- a first layer having at least one integrated circuit formed thereon;
- one or more electrically insulating layers disposed about said first layer;
- one or more shielding layers disposed about said first layer;
- one or more electrically resistive layers disposed over one of: (1) said one or more electrically insulating layers or (2) said one or more shielding layers; and
- one or more cooling layers with at least one of the at least or more cooling layers having one or more cooling channels provided therein with the cooling channels substantially coplanar with the resistive layers.

18. The semiconductor device of claim 17 wherein:
the integrated circuit formed on said first layer corresponds to one of: a logic circuit or a memory circuit;
said one or more electrically insulating layers are disposed over said first layer; and
said one or more electrically resistive layers are disposed over said one or more electrically insulating layers and are provided having cooling passages therein.

19. The semiconductor device of claim 18 where at least one of said one or more insulative layers is adjacent to one of the one or more shielding layers.

* * * * *